United States Patent
Harris et al.

(10) Patent No.: US 11,367,711 B2
(45) Date of Patent: Jun. 21, 2022

(54) OPTICALLY INTERFACED STACKED MEMORIES AND RELATED METHODS AND SYSTEMS

(71) Applicant: Lightmatter, Inc., Boston, MA (US)

(72) Inventors: Nicholas C. Harris, Boston, MA (US); Carl Ramey, Westborough, MA (US)

(73) Assignee: Lightmatter, Inc., Boston, MA (US)

( * ) Notice: Subject to any disclaimer, the term of this patent is extended or adjusted under 35 U.S.C. 154(b) by 0 days.

(21) Appl. No.: 17/055,549

(22) PCT Filed: Apr. 30, 2019

(86) PCT No.: PCT/US2019/029803
§ 371 (c)(1),
(2) Date: Nov. 13, 2020

(87) PCT Pub. No.: WO2019/221902
PCT Pub. Date: Nov. 21, 2019

(65) Prior Publication Data
US 2021/0118853 A1    Apr. 22, 2021

Related U.S. Application Data

(60) Provisional application No. 62/680,195, filed on Jun. 4, 2018, provisional application No. 62/673,046, filed on May 17, 2018.

(51) Int. Cl.
*H01L 25/065* (2006.01)
*G02B 6/26* (2006.01)
(Continued)

(52) U.S. Cl.
CPC .......... *H01L 25/0657* (2013.01); *G02B 6/262* (2013.01); *G06F 13/1668* (2013.01);
(Continued)

(58) Field of Classification Search
CPC ........... G11C 5/02; G11C 5/04; G11C 7/1081; G11C 11/4093; G11C 13/04;
(Continued)

(56) References Cited

U.S. PATENT DOCUMENTS

6,202,165 B1    3/2001 Pine
7,251,386 B1    7/2007 Dickinson et al.
(Continued)

FOREIGN PATENT DOCUMENTS

EP    2212887       4/2013
EP    3159721 A1    4/2017
(Continued)

OTHER PUBLICATIONS

I. A. Young et al., "Optical technology for energy efficient I/O in high performance computing," in IEEE Communications Magazine, vol. 48, No. 10, pp. 184-191, Oct. 2010, doi: 10.1109/MCOM.2010. 5594695. (Year: 2010).*

(Continued)

*Primary Examiner* — Ajay Ojha
(74) *Attorney, Agent, or Firm* — Wolf, Greenfield & Sacks, P.C.

(57) ABSTRACT

A memory device is described. The memory device comprises a plurality of stacked memory layers, wherein each of the plurality of stacked memory layers comprises a plurality of memory cells. The memory device further comprises an optical die bonded to the plurality of stacked memory layers and in electrical communication with the stacked memory layers through one or more interconnects. The optical die comprises an optical transceiver, and a memory controller configured to control read and/or write operations of the stacked memory layers. The optical die may be positioned at one end of the plurality of stacked memory layers. The one or more interconnects may comprise one or more through (Continued)

silicon vias (TSV). The plurality of memory cells may comprise a plurality of solid state memory cells. The memory devices described herein can enable all-to-all, point-to-multipoint and ring architectures for connecting logic units with memory devices.

29 Claims, 13 Drawing Sheets

(51) Int. Cl.
   *G11C 5/02* (2006.01)
   *G06F 13/16* (2006.01)
   *G06F 13/40* (2006.01)

(52) U.S. Cl.
   CPC ............ *G06F 13/4027* (2013.01); *G11C 5/02* (2013.01); *H01L 2225/06541* (2013.01)

(58) Field of Classification Search
   CPC .............. G11C 7/1054; H01L 25/0657; H01L 2225/06541; H01L 2225/06534; H01L 25/18; G02B 6/262; G02B 6/30; G02B 6/3652; G02B 6/4243; G02B 6/12002; G02B 6/12004; G02B 6/43; G06F 13/1668; G06F 13/4027
   See application file for complete search history.

(56) References Cited

U.S. PATENT DOCUMENTS

| | | | |
|---|---|---|---|
| 9,922,887 | B2 | 3/2018 | Vermeulen et al. |
| 2008/0044128 | A1 | 2/2008 | Kish, Jr. et al. |
| 2008/0089640 | A1 | 4/2008 | Beausoleil |
| 2011/0073989 | A1 | 3/2011 | Rong et al. |
| 2011/0128790 | A1 | 6/2011 | Sarin et al. |
| 2012/0149148 | A1 | 6/2012 | Dallesasse et al. |
| 2012/0177381 | A1 | 7/2012 | Dobbelaere et al. |
| 2013/0051725 | A1 | 2/2013 | Shinoda et al. |
| 2013/0071121 | A1 | 3/2013 | Sharapov et al. |
| 2013/0209112 | A1 | 8/2013 | Witzens |
| 2013/0292840 | A1 | 11/2013 | Shoemaker et al. |
| 2013/0308893 | A1 | 11/2013 | Zuffada et al. |
| 2014/0040698 | A1 | 2/2014 | Loh et al. |
| 2014/0043050 | A1 | 2/2014 | Stone et al. |
| 2014/0264400 | A1 | 9/2014 | Lipson et al. |
| 2014/0300008 | A1 | 10/2014 | Duan et al. |
| 2014/0363124 | A1 | 12/2014 | Pelley et al. |
| 2016/0181322 | A1 | 6/2016 | Mazed et al. |
| 2016/0191188 | A1 | 6/2016 | Butler |
| 2017/0160474 | A1* | 6/2017 | Mahmoodian ......... G02B 6/124 |
| 2019/0162901 | A1 | 5/2019 | Yu et al. |
| 2019/0335252 | A1* | 10/2019 | Ryan .................... H04B 10/803 |
| 2020/0284981 | A1 | 9/2020 | Harris et al. |

FOREIGN PATENT DOCUMENTS

| | | |
|---|---|---|
| WO | 2011/143548 A2 | 11/2011 |
| WO | 2016/008771 A1 | 1/2016 |

OTHER PUBLICATIONS

R. G. Beausoleil, P. J. Kuekes, G. S. Snider, S. Wang and R. S. Williams, "Nanoelectronic and Nanophotonic Interconnect," in Proceedings of the IEEE, vol. 96, No. 2, pp. 230-247, Feb. 2008, doi: 10.1109/JPROC.2007.911057. (Year: 2008).*
Invitation to Pay Additional Fees for International Application No. PCT/US2020/021209 dated May 1, 2020.
International Search Report and Written Opinion for International Application No. PCT/US2020/021209, dated Jul. 6, 2020.
International Preliminary Report on Patentability for International Application No. PCT/US2019/029803 dated Nov. 26, 2020.
International Search Report and Written Opinion for International Application No. PCT/US2019/029803 dated Sep. 3, 2019.
Invitation to Pay Additional Fees for International Application No. PCT/US2019/029803 dated Jun. 16, 2019.
Fujikata et al., LSI on-chip optical interconnection with Si nanophotonics. Extended Abstracts of the 2007 International Conference on Solid State Devices and Materials. 2007. pp 276-277.
Grigalunas, Tell Me—What Is Wafer Dicing? Eastern States Components, LLC. Sep. 26, 2017. 2 pages. URL:https://www.escomponents.com/blog/2017/9/26/tell-me-what-is-wafer-dicing [retrieved Jul. 13, 2020].
Wada, Electronics and Photonics Convergence on Si CMOS Platform. Proc. of SPIE. 2004;5357:16-24.
PCT/US2019/029803, Jun. 16, 2019, Invitation to Pay Additional Fees.
PCT/US2019/029803, Sep. 3, 2019, International Search Report and Written Opinion.
PCT/US2019/029803, Nov. 26, 2020, International Preliminary Report on Patentability.
PCT/US2020/021209, May 1, 2020, Invitation to Pay Additional Fees.
PCT/US2020/021209, Jul. 6, 2020, International Search Report and Written Opinion.
Extended European Search Report dated Feb. 11, 2022 in connection with European Application No. 19803311.0.

* cited by examiner

OPTICALLY INTERFACED STACKED MEMORIES AND RELATED METHODS AND SYSTEMS

RELATED APPLICATIONS

The present application is a national stage filing under 35 U.S.C. § 371 of International Patent Application Serial No. PCT/US2019/029803 entitled "OPTICALLY INTERFACED STACKED MEMORIES AND RELATED METHODS AND SYSTEMS", filed Apr. 30, 2019, which is incorporated herein by reference in its entirety.

International Patent Application Serial No. PCT/US2019/029803 claims the benefit under 35 U.S.C. § 119(e) of U.S. Provisional Patent Application Ser. No. 62/673,046 entitled "OPTICALLY INTERFACED STACKED MEMORIES AND RELATED METHODS AND SYSTEMS," filed May 17, 2018, which is incorporated herein by reference in its entirety, and claims the benefit under 35 U.S.C. § 119(e) of U.S. Provisional Patent Application Ser. No. 62/680,195 entitled "OPTICALLY INTERFACED STACKED MEMORIES AND RELATED SYSTEMS AND METHODS," filed Jun. 4, 2018, which is incorporated herein by reference in its entirety.

BACKGROUND

Computer systems include random-access memories (RAM) for storing data and machine code. RAMs are typically volatile memories, such that the stored information is lost when power is removed. In modern implementations, RAMs take the form of integrated circuits. Each integrated circuit includes several RAM cells.

Dynamic random-access memories (DRAM) are a particular type of RAM that store bits of data in the form of electric charges inside capacitors of an integrated circuit. For example, a discharged capacitor may represent a 0 and a charged capacitor may represent a 1. The advantage of DRAMs over other types of RAMs is that each cell is implemented using a single transistor and a capacitor, compared to four or six transistors in static random-access memories (SRAMs). The disadvantage is that the charge of the capacitors leaks off over time. Accordingly, DRAMs require circuits for periodically refreshing the state of its capacitors.

To enable access to stored data and machine code, RAMs are place in electrical communication with processors. Typically, these electrical communications are implemented as metal traces formed on the substrates on which the RAMs and the processors are disposed.

BRIEF SUMMARY

Some embodiments relate to a memory device comprising a plurality of stacked memory layers, each of the plurality of stacked memory layers comprising a plurality of memory cells, and an optical die bonded to the plurality of stacked memory layers and in electrical communication with at least one of the plurality of stacked memory layers through one or more interconnects. The optical die comprises an optical transceiver, and a memory controller configured to control read and/or write operations of the at least one of the plurality of stacked memory layers.

The one or more interconnects may comprise one or more through silicon vias (TSV).

The optical die may further comprise one or more pads in electrical communication with the one or more TSVs.

The memory controller may comprise at least one logic element.

The plurality of memory cells may comprise a plurality of solid state memory cells.

The optical die may be positioned at one end of the plurality of stacked memory layers.

The optical die may further comprise an optical coupler arranged for edge-coupling an optical fiber to the optical transceiver.

The optical coupler may comprise a V-groove or a grating coupler.

The optical transceiver may be configured to perform wavelength division multiplexing (WDM).

The plurality of stacked memory layers may be stacked on one another in a three-dimensional (3D) configuration.

The optical transceiver may comprise at least one photodetector and at least one optical modulator.

The optical die may be 3D bonded to the plurality of stacked memory layers.

The optical die may be formed from a silicon on insulator (SOI) substrate.

The optical die may have a surface defining a plane, and the optical die may further comprise a grating coupler configured to be coupled to an out-of-plane optical mode.

Some embodiments relate to a method for accessing a memory device, the method comprising with an optical transceiver disposed on a same die with a memory controller, receiving an optical signal and converting the optical signal to an electrical signal, and with the memory controller, generating, based on the electrical signal, a plurality of control signals and transmitting the plurality of control signals to a plurality of stacked memory layers bonded to the die.

The method may further comprise with at least one of the plurality of stacked memory layers, perform at least one write and/or read operation in response to receiving the plurality of control signals.

The method may further comprise with a logic unit optically coupled through an optical fiber to the die, transmitting the optical signal to the optical transceiver.

The method may further comprise with the memory controller, receiving one or more bits from at least one of the plurality of stacked memory layers, and with the optical transceiver, encoding an optical transmission signal with the one or more bits.

Some embodiments relate to a computing system comprising a logic unit having an optical input/output (I/O) interface, an optical channel optically coupled to the I/O interface of the logic unit, and a memory device. The memory device comprises a plurality of stacked memory layers, each of the plurality of stacked memory layers comprising a plurality of memory cells, and an optical die bonded to the plurality of stacked memory layers and in electrical communication with at least one of the plurality of stacked memory layers through one or more interconnects. The optical die comprises an optical transceiver optically coupled to the optical channel, and a memory controller configured to control read and/or write operations of the at least one of the plurality of stacked memory layers.

The one or more interconnects may comprise one or more through silicon vias (TSV).

The memory controller may comprise at least one logic element.

The plurality of stacked memory layers may be stacked on one another in a three-dimensional (3D) configuration.

The optical die may be 3D bonded to the plurality of stacked memory layers

The optical channel may comprise an optical fiber having a first end coupled to I/O interface and a second end coupled to the optical die.

The optical channel may comprise a free space optical channel.

The memory device may be positioned on a surface of the logic unit, the surface of the logic unit defining a plane. The memory device may comprise a first out-of-plane coupler and the logic unit comprises a second out-of-plane coupler, the first out-of-plane coupler being optically coupled to the second out-of-plane coupler through the optical channel.

At least one between the first and second out-of-plane couplers may comprise a grating coupler.

The logic unit may comprise optical circuitry for processing data in the optical domain.

The logic unit and the memory device may be disposed on a common printed circuit board (PCB). The computing system may lack interposers between the PCB and the memory device.

Some embodiments relate to a computing system comprising a plurality of computing nodes comprising at least first, second and third computing nodes. Each of the plurality of computing nodes comprises a logic unit, and a memory device optically coupled to the logic unit. The memory device may comprise a plurality of stacked memory layers. The first computing node is optically coupled to the second computing node and the third computing node.

The logic unit of the first computing node may be optically coupled to the memory device of the second computing node and the memory device of the third computing node.

The plurality of computing nodes may form an all-to-all architecture, a point-to-multipoint architecture or a ring architecture.

The first computing node may be optically coupled to the second computing node through an optical fiber that is longer than 10 cm.

The first computing node may be optically coupled to the second computing node through an optical fiber that is longer than 1 m.

Some embodiments relate to a method for fabricating a memory. The method comprises fabricating a plurality of memory layers and stacking the plurality of memory layers to each other, fabricating an optical die including a memory controller and an optical transceiver, and bonding the optical die to the stacked memory layers such that the memory controller is in electrical communication with at least one of the memory layers.

The method may further comprise connecting an optical fiber to the optical die.

Connecting the optical fiber to the optical die may comprise placing the optical fiber in optical communication with the optical transceiver.

Connecting the optical fiber to the optical die may comprise positioning a portion of the optical fiber in a v-groove.

The method may further comprise mounting the optical die to a printed circuit board.

Fabricating the plurality of memory layers may comprise fabricating the plurality of memory layers with a first fabrication node, and fabricating the optical die may comprise fabricating the optical die with a second fabrication node less than the first fabrication node.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

I. The Memory Bandwidth Bottleneck

The inventors have recognized and appreciated that one of the major bottlenecks limiting the spread of data-intensive computing is the inability to scale modern computing systems in terms of memory bandwidth and overall memory capacity. Not only does data-intensive computing require access to vast amounts of data, but it does so with large bandwidths. Memory bandwidth is the rate at which data can be read from or stored into a semiconductor memory by a processor. Current computing systems rely on graphical processing units (GPU) to increase memory bandwidth relative to implementations based on general purpose processors. Some NVIDIA GPUs, for example, have the ability to transfer data from a memory at bandwidths as high as 256

GB/s. While such a memory bandwidth may be sufficient for most graphic-based applications, it is far from being enough for certain data-intensive applications, including for example deep neural networks and other types of machine learning networks, and computing systems designed for high-frequency trading.

Deep neural networks, for example, rely on vast amounts of data, such as weights and activation parameters. A typical 50-layer network, for example, with 26 million weight parameters can compute up to 16 million activations in a forward pass. If weights and activations are stored using 32-bit floating point values, the total storage requirement is 168 MB. In addition, if data are laid out as dense vectors, the memory requirement can increases to several gigabytes. During training, locality of the training dataset is important because of the frequency of access for these large datasets. These amounts of data are far too large to be stored in the internal memory of the GPU, and therefore call for the use of external DRAMs. Another example is memory intensive datacenter workloads which are DDR (DRAM) bandwidth bound. These workloads could include service-provider applications such as video streaming and network caching.

Figure 1:
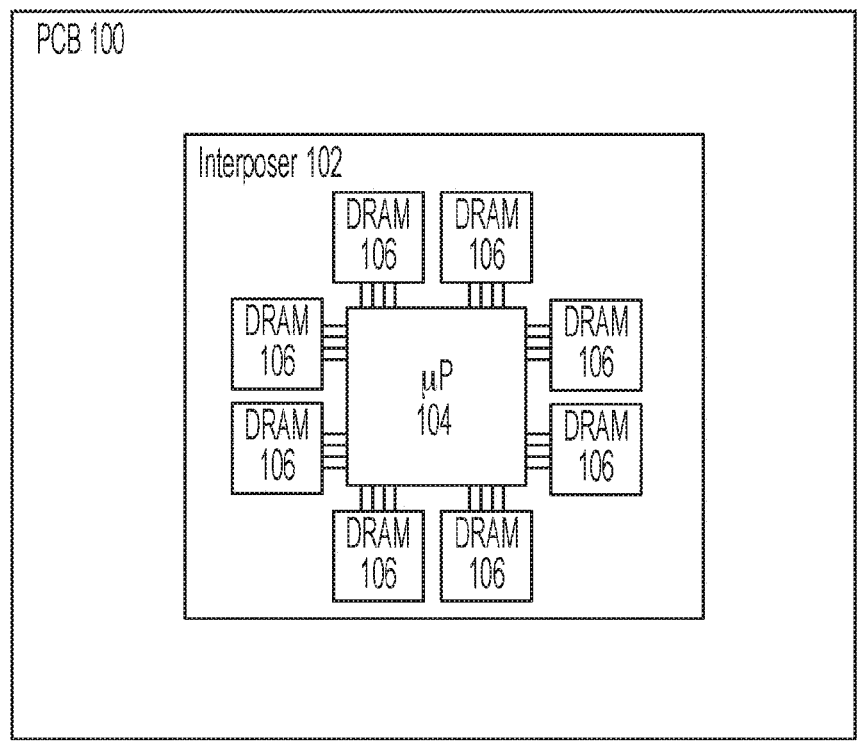
FIG. 1 is a schematic diagram of a conventional system including a microprocessor and a plurality of memory units.

FIG. 1 is a schematic diagram illustrating a conventional architecture including a microprocessor (such as a GPU) in communication with multiple external DRAM units. During operation, the microprocessor may access one or more DRAM units to perform various operations, including reading data, writing data, caching, buffering, etc. As shown, microprocessor 104 and DRAM units 106 sit on an interposer 102, which in turn sits on a printed circuit board (PCB) 100. Each DRAM unit is in communication with the microprocessor through multiple conductive traces formed on the interposer (often several hundreds of traces) for transferring data back and forth. It should be noted that the microprocessor and the DRAM units are disposed on the interposer, rather than directly on the PCB, because the interposer is more suitable for hosting the numerous conductive traces necessary for microprocessor/DRAM communications. In fact, interposers of the type of interposer 102 are typically produced using microfabrication techniques, such as the same microfabrication techniques used for integrated circuits, thus allowing for a much greater density of conductive trace density relative to PCBs.

Each conductive trace inevitably introduces a non-zero impedance (e.g., a non-zero resistance and a non-zero capacitance) in the electrical path between the microprocessor and the respective DRAM unit. Large values of impedance are undesirable for a variety of reasons, including because 1) they limit the maximum data rate that can be transferred through the trace with a negligible bit error rate, and 2) they lead to large amounts of power consumed to transfer data through the traces. To that end, each trace can be viewed as an RC circuit, where the electrical bandwidth is proportional to 1/RC and the power consumption is proportional to $CV^2$ (where V is the voltage with which a trace is driven).

The value of the impedance depends, among other parameters, on the length of the trace. In particular, the longer the trace the larger the value of the impedance. For this reason, the closer a DRAM unit is to the microprocessor the higher the data rate that the trace can support and the lower the overall power consumption. As a result, the DRAM units are all positioned adjacent the perimeter of the microprocessor. Unfortunately, there are only so many DRAM units than can be positioned near the perimeter of the microprocessor, due to its finite size. For example, the system of FIG. 1 is such that only eight DRAM units 106 can physically be positioned within a certain distance of the perimeter of the microprocessor (it should be appreciated that this example is provided for illustrative purposes only and is not intended to be realistic). Due to the lack of space near the microprocessor, additional DRAM units would have to be positioned farther away than DRAM units 106. The result is that the length of the traces between the microprocessor and the additional DRAM units would be significantly larger than the traces shown in FIG. 1. Therefore, the additional memory capacity would come at the expense of a significant increase in power consumption. It is estimated that the additional power consumed in a typical GPU-based system owing to the length of the traces when 10s of DRAM units are added at 1 cm of the processor is of the order of 10s of Watts. Unfortunately, the additional power consumption is unacceptable, especially when large amounts of memory are needed to support data-intensive applications. It should be readily apparent, therefore, that simply adding memory capacity to current GPU-based systems is not a scalable solution.

There is a further bottleneck that renders current computing systems insufficiently scalable, which arises owing to the use of interposers. As explained above, the system of FIG. 1 relies on the use of an interposer for routing data between the DRAM units and the microprocessor, since interposers can accommodate a far greater density of conductive trace compared to PCBs. Being formed using microfabrication techniques, however, entails that these interposers have small footprints, thus limiting the number of DRAM units that can be accommodated on them. Typical interposers have areas in the order of 500 mm$^2$. Therefore, there is an upper limit to the maximum number of DRAM units that can be included in a system using an interposer, and as a result, to the maximum memory capacity.

II. Computing Systems Based on Optically Interfaced Stacked Memories

Recognizing the aforementioned limitations of conventional architectures, the inventors have developed systems in which the memory bandwidth and the overall memory capacity can be scaled without significantly affecting the overall power consumption of the system. Some embodiments of the present disclosure are directed to optically interfaced stacked memories, in which multiple layers of memory cells are stacked on top of one another, thus increasing memory density per unit area, and in which data streams are routed between the memory units and the microprocessor(s) using optical carriers. Unlike conductive traces, optical channels (e.g., optical fibers or free space optics) do not introduce impedance in the path between the memory and the microprocessor, even if the length of the channel is increased. Consequently, the power consumed for transferring data, and the maximum data rate than can be transferred through an optical channel with negligible bit error rates is not affected by the length of the optical channel. As a result, the memory units need not be positioned near the perimeter of the microprocessor, as in GPU-based systems. This, in turn, enables a greater flexibility in the overall architecture of a computing system.

One of the effects of longer optical channels is increased attenuation loss. Attenuation loss may have an impact of the overall power budget of an optical link, since photodetectors require a minimum amount of optical power to operate in an error-free fashion. Attenuation loss, however, is negligible.

Some single-mode optical fibers operating in the C-band, for example, introduce attenuation losses of as low as 0.2 dB/Km.

Figure 2:
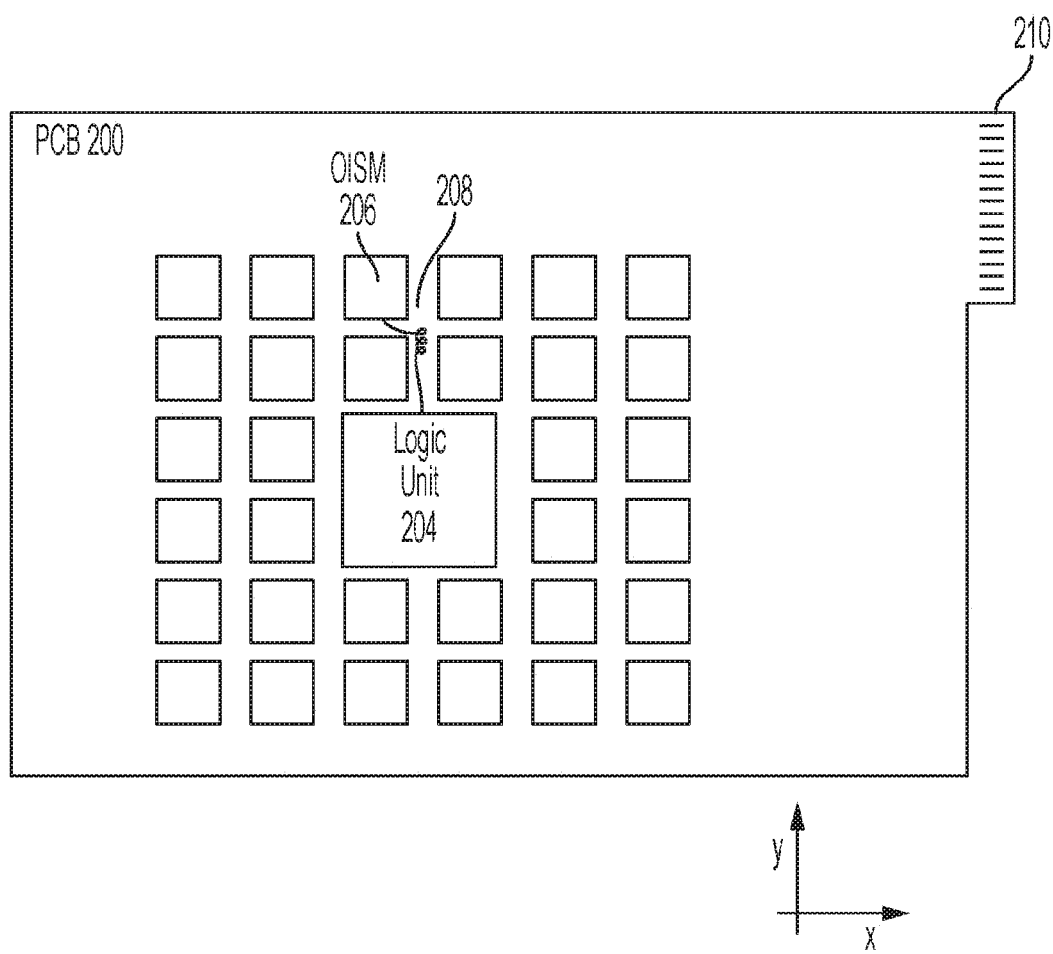
FIG. 2 is a schematic diagram of a system including a logic unit and a plurality of optically interfaced stacked memory (OISM) units, in accordance with some non-limiting embodiments.

One example of a system including optically interfaced stacked memories is depicted in FIG. 2, in accordance with some non-limiting embodiments. The system of FIG. 2 includes a plurality of optically interfaced stacked memory (OISM) units 206 (for clarity, only one OISM has been labeled in FIG. 2) and a logic unit 204. In this example, each of the OISMs communicates with the logic unit 204 via an optical fiber 208 (again, only one optical fiber is illustrated in FIG. 2 for the sake of clarity), though other types of optical channels may alternatively or additionally be used. For example, optical channel connecting each OISM to the logic unit 204 may include a waveguide and/or a free-space optical channel. Additionally, one or more of the OISMs may be connected directly to one or more of the other OISMs for direct communication of data between the OISMs.

Unlike the system of FIG. 1, in this case the memory units may be disposed directly on a printed circuit board (PCB) 200, without having to rely on an interposer (though interposers may be used in some circumstances). One advantage of not having to use interposers is a substantial reduction in the cost and complexity of the system, since interposers are costly, require complex, time-consuming manufacturing techniques (e.g., lithography), and have limited areas for accommodating electronic devices. In fact, the use of optical channels for transferring data between the memories and the logic unit may eliminate, at least in some embodiments, the need for conductive traces. Without an interposer, the space that can be used to accommodate additional OISMs is virtual unlimited. In the embodiments in which the OISMs are positioned on the same PCB, the space that can be used to accommodate additional OISMs is limited only by the area of the PCB, which in some embodiments can be 500 cm² or even more. It should be noted, however, that not all OISMs need be positioned on the same PCB. For example, OISMs may be located on one or more separate PCBs within a device and connected to the logical unit 204 via optical fibers. Such unique architectures are possible in some embodiments because the constraint on the distance between the OISMs and the associated logic unit 204 is greatly reduced by using optical connections rather than electrical connections.

PCB 200 may include conductive contacts 210, which may be arranged for insertion into a corresponding socket of a motherboard. Any suitable type of protocol may be used for the PCB/motherboard interface, including but not limited to PCI Express.

It should be noted that the OISMs 206 can be placed as far away from the logic unit 204 as desired (e.g., more than 10 cm, more than 1 m, more than 10 m), since the length of an optical fiber has virtually no effect on the overall power consumption or the bandwidth of the system. Consequently, additional OISMs can be included on the same PCB 200 or other PCBs not shown in FIG. 2, thus increasing the system's overall memory bandwidth and capacity. In the system of FIG. 2, only two rows of OISMs surrounding logic unit 204 are illustrated. However, it should be appreciated that any other suitable number of OISMs, and/or any other suitable topological arrangement may be employed in other embodiments.

Each OISM may be equipped with circuitry for transmitting and receiving optical signals to and from logic unit 204 or other OISMs. Similarly, logic unit 204 may be equipped with circuitry for transmitting and receiving optical signals to and from the OISMs. In some embodiments, each OISM may be optically coupled to the logic unit 204 through a dedicated optical fiber. In other embodiments, optical fibers may be shared among multiple OISMs, for example by leveraging wavelength division multiplexing (WDM), time division multiplexing (TDM) or other types of multiplexing techniques. Although only one logic unit is illustrated in this example, OISMs may be shared among multiple logic units in some embodiments.

Logic unit 204 may include any suitable type of circuit for processing data. For example, logic unit 204 may include a general purpose microprocessor, a graphics processing unit (GPU), an application specific integrated circuit (ASIC), and/or a field programmable gate array (FPGA), among others. In some embodiments, as will be described further below, logic unit 204 may include optical circuitry for processing data in the optical domain.

Using the techniques described herein, memory bandwidths in excess of 1 TB/s can be accomplished with insignificant additional power consumption due to the increased capacity (e.g., less than 1 W for every additional 500 GB/s of memory bandwidth).

III. Examples of Optically Interfaced Stacked Memories

Figure 3:
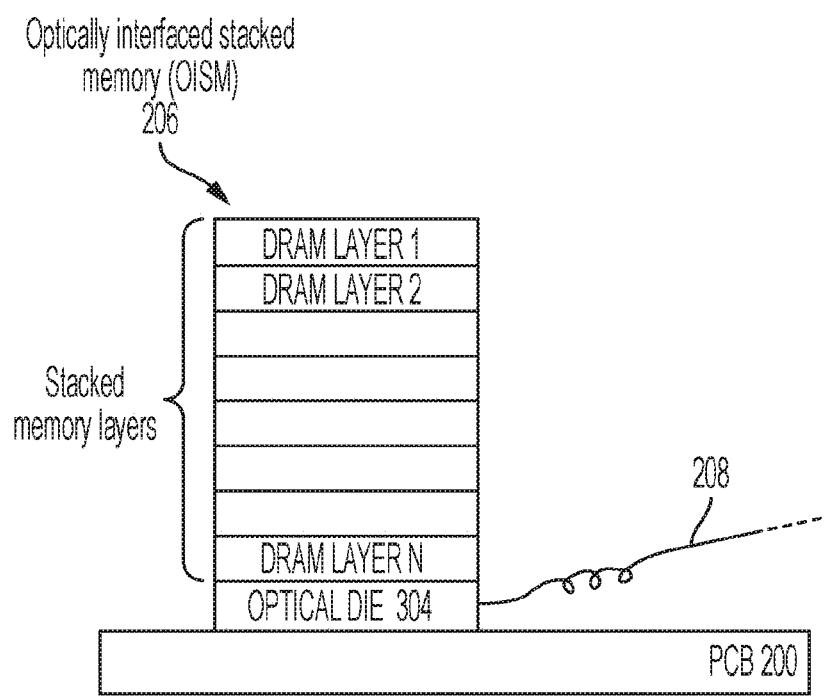
FIG. 3 is a side view of a representative OISM, in accordance with some non-limiting embodiments.

An example of an OISM is illustrated in FIG. 3, in accordance with some non-limiting embodiments. In this example, OISM 206 includes a plurality of DRAM layers 1, 2 . . . N stacked on top of one another. Each DRAM layer may be formed from a silicon die and may include multiple DRAM cells for storing bits therein. The DRAM cells are not limited to any specific implementation. The DRAM layers 1, 2 . . . N may be bonded to one another using any suitable bonding technique, including but not limited to flip-chip bonding or other three-dimensional (3D) integration techniques. As described further below, the memory layers 1, 2 . . . N may be electrically coupled to one another using through-silicon vias (TSV). Having multiple DRAM layers stacked on one another as described herein may allow for a substantial increase in the memory density per unit area on the PCB.

OISM 206 further includes an optical die 304, which may serve as the optical interface between the memory unit and other components. For example, optical fiber 208 may have an end attached to optical die 304, though other types of optical channels other than optical fibers may be used. The opposite end of the optical fiber 208 may be connected to another component, such as logic unit 204 or another OISM. Although optical die 304 is illustrated as being disposed at one end of the memory stack, not all embodiments are limited in this respect. For example, in other implementations, an optical die 304 may be positioned between one memory layer and another. As described above, an OISM may be disposed directly on a PCB 200, thus removing the need for complex and costly interposers.

Although DRAM layers have been described in connection with FIG. 3, it should be noted that the present disclosure is not limited to any specific type of memory. In other embodiments, for example, layers of NAND memories, SRAM (static RAM), memories or Flash memories may be stacked and may be optically interfaced to other components in the manner described herein.

Figure 4:
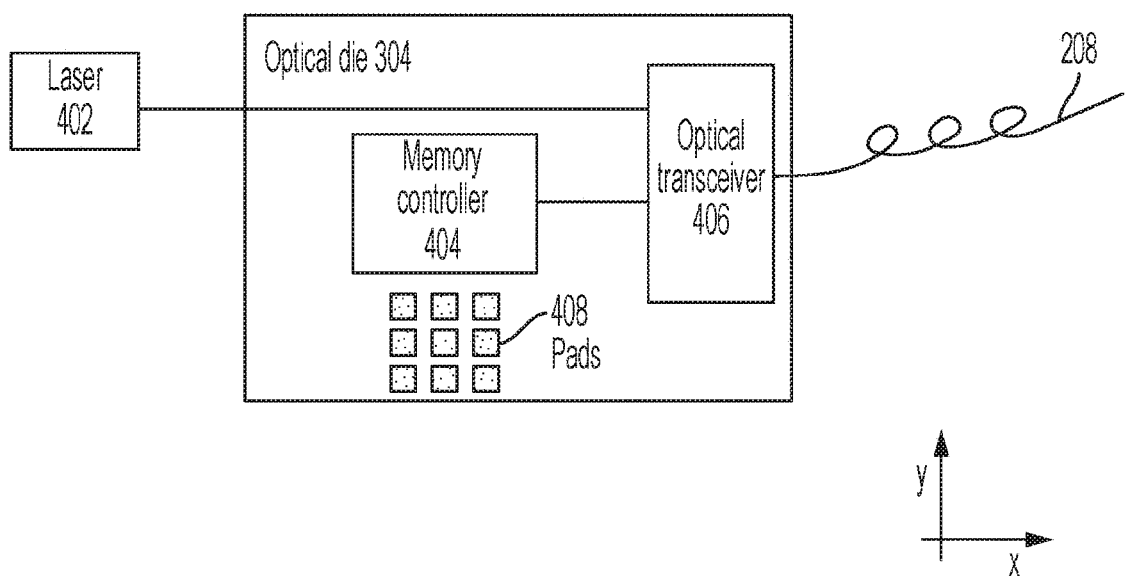
FIG. 4 is a schematic diagram of an optical die than could be used in connection with the OISM of FIG. 3, in accordance with some non-limiting embodiments.

Optical die 304 may include electronic and optical circuits. One example of an optical die is illustrated in FIG. 4, in accordance with some non-limiting embodiments. In this case, optical die 304 includes a memory controller 404, an optical transceiver 406, and conductive pads 408, among other possible components. Pads 408 may be used for distributing electrical signals to and from the DRAM layers 1, 2 . . . N arranged vertically above the optical die 304 (in the z-direction), as will be described further below.

Memory controller 404 may be arranged to manage the flow of data going to and coming from the memory layers 1, 2 . . . N, including executing read/write operations. For example, memory controller 404 may transfer data to be stored to the memory layers 1, 2 . . . N, may send requests for data from the memory layers, may determine which layers and which specific DRAM cells can be rewritten, may erase bits from certain DRAM cells of the memory layers, etc. Memory controller 404 may communicate to the DRAM layers via pads 408, and interconnects (not shown in FIG. 4) connected to the pads.

Optical transceiver 406 may convert optical signals received through the optical fiber 208 into the electrical domain and vice versa. For example, optical transceiver 406 may include one or more modulators for encoding bit streams into an optical carrier. Any suitable modulation format may be used, including for example on-off keying (OOK), or more complex multi-level schemes such as binary phase shift keying (BPSK), 4-PSK, 8-PSK, 16-PSK, etc., among others. Different types of modulators may be used for this purpose, including but not limited to Mach-Zehnder modulators, electro-absorption optical modulators, and/or resonant modulators. Optical transceiver 406 may further include one or more photodetectors for extracting data from the received optical signals. Any suitable type of photodetector may be used, including germanium-based photodiodes. In some embodiments, WDM techniques may be used for sharing common optical fibers among multiple OISMs.

Figure 5A:
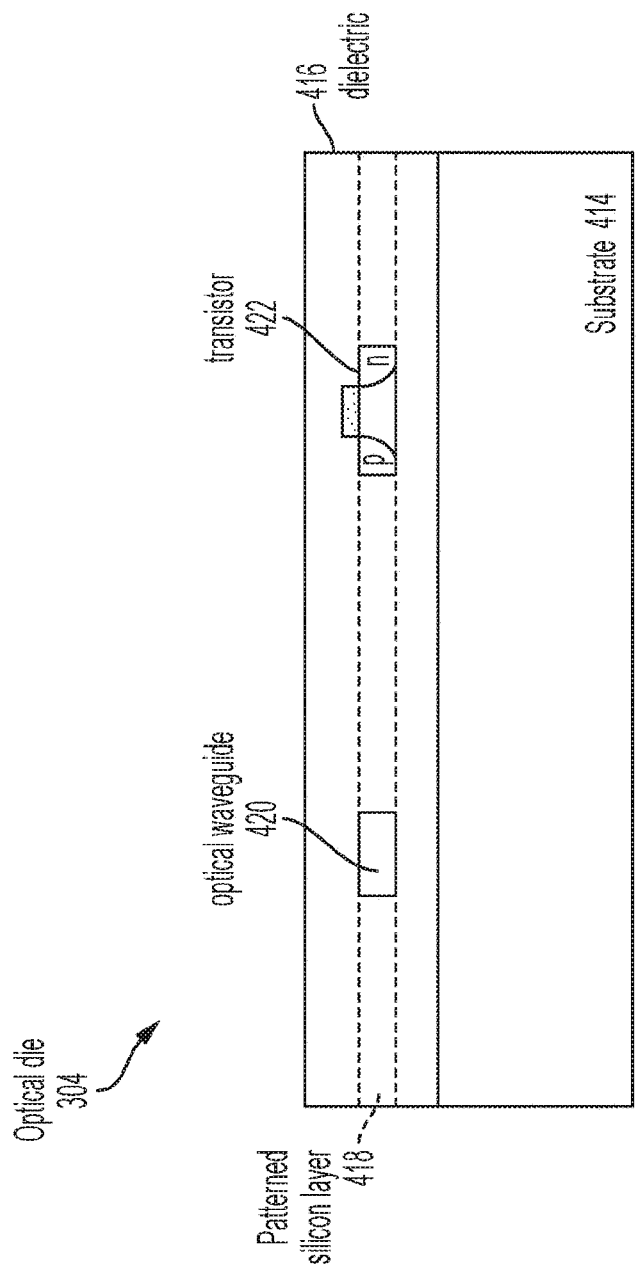
FIG. 5A is a schematic diagram of a silicon die including a waveguide and a transistor fabricated in the same silicon layer, in accordance with some non-limiting embodiments.

In the embodiment of FIG. 4, memory controller 404 and optical transceiver 406 are disposed on the same die (though they may be disposed on separate dies in other embodiments). Therefore, memory controller 404 and optical transceiver 406 are co-fabricated using the same microfabrication process, and may at least in some embodiments be fabricated using common photomasks. The optical die of FIG. 5A, for example, illustrates a case in which an optical waveguide 420 and a transistor 422 may be co-fabricated on the same silicon substrate 414. As shown, optical waveguide 420 and transistor 422 are fabricated by patterning the same silicon layer 418, which may be embedded in a dielectric layer 416. Optical waveguide 420 may be part of optical transceiver 406 and transistor 422 may be part of memory controller 404. Of course, optical transceiver 406 may include additional optical waveguides and other optical devices patterned in the silicon layer 418, and memory controller 404 may include additional transistors patterned in the same layer. It should be noted that bulk silicon substrates or silicon-on-insulators (SOI) substrates may be used, among others, for optical die 304.

Figure 5B:
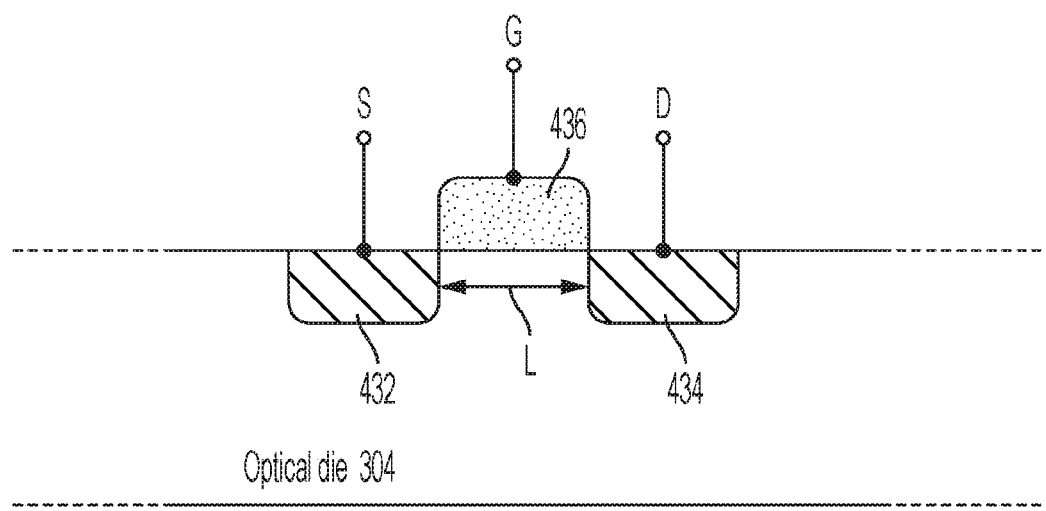
FIG. 5B is a schematic diagram of a representative transistor that may be used in the optical die of FIG. 4, in accordance with some non-limiting embodiments.

One challenge arising from the fact that memory controller 404 and optical transceiver 406 are co-fabricated on the same die is that design trade-offs may be necessary. One such trade-off is due to the lack of availability, within most semiconductor foundries, of processes for the fabrication of optical devices at small fabrication nodes (e.g., less than 45 nm, less than 32 nm, or less than 22 nm). Being patterned on the same substrate implies that the same fabrication node should be used, in order to limit costs, for the formation of the memory controller and the optical transceiver. The result is that small fabrication nodes cannot be used (without a significant increase in fabrication costs) for the memory controller. This limitation is not desirable since small fabrication nodes lead to better performance, including increased data rate and reduced power consumption. Memory controller in conventional DRAMs, for example, are fabricated using 22 nm fabrication nodes or less. Therefore, co-fabricating optical transceivers and memory controller on a common silicon die as described herein may come at the expense of memory controllers fabricated with larger-than-ideal fabrication nodes. The transistor of FIG. 5B for example has been fabricated with a 45 nm fabrication node. Therefore, the separation L between the source well 432 and the drain well 434 (i.e., the length of the transistor's channel) is no greater than 45 nm. It should be appreciated that fabrication nodes other than 45 nm may be used for fabricating silicon die 304, including 250 nm, 130 nm, 65 nm, 32 nm, 22 nm, 14 nm, 10 nm, 7 nm and any other value between such values.

Figure 6:
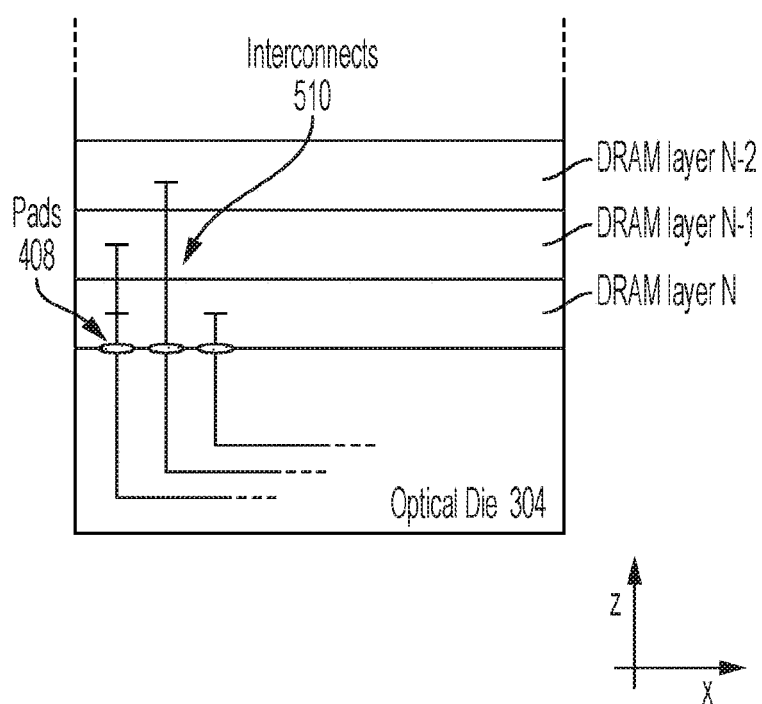
FIG. 6 is a side view of a representative OISM including a plurality of interconnects coupling an optical die to multiple dynamic random access memory (DRAM) layers, in accordance with some non-limiting embodiments.

FIG. 6 illustrates how the DRAM layers 1, 2 . . . N and the optical die 304 may be electrically connected to each other, at least in some embodiments. As shown, interconnects 510 (e.g., through-silicon vias or through-oxide vias) may run through the DRAM layers 1, 2 . . . N and may be connected to pads 408. Micro-bumps or other types of bumps may be formed on pads 408 to ensure proper electrical connection between a DRAM layer and the silicon die 304.

Figure 7:
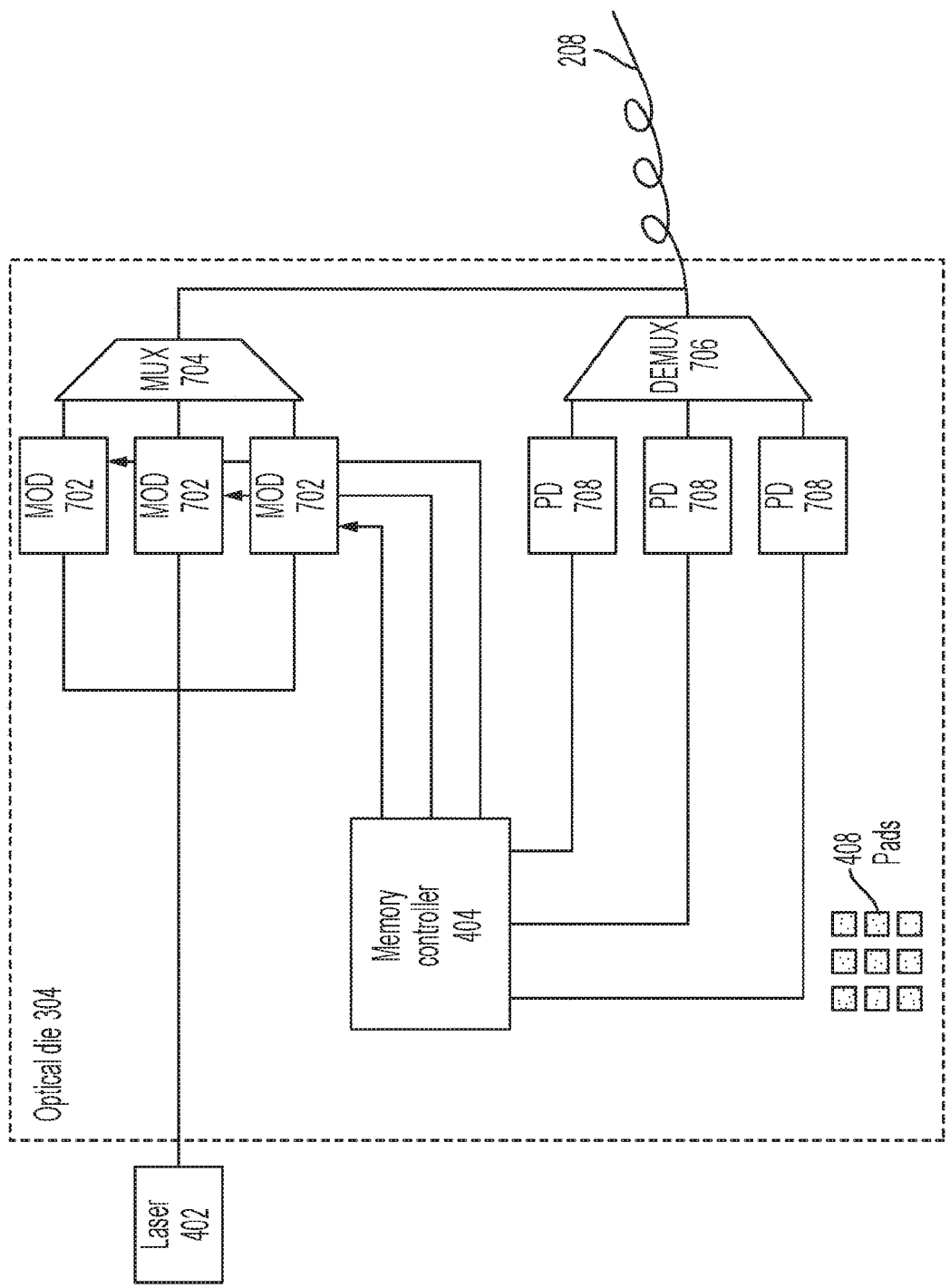
FIG. 7 is a schematic diagram of an optical die with wavelength division multiplexing (WDM) capabilities, in accordance with some non-limiting embodiments.

As described above, in some embodiments WDM techniques may be used to transmit multiple data streams in a single optical fiber. WDM techniques may introduce additional flexibility in the design of computing systems of the types described herein as smaller numbers of optical fibers may be needed. Multiplexers and de-multiplexers may be used to support WDM architectures. The multiplexers and de-multiplexers may be integrated in optical transceivers 406 and logic unit 204, or may be deployed as discrete components outside the logic units and the OISMs. One example of a silicon die 304 being arranged to support WDM communications is illustrated in FIG. 7, in accordance with some non-limiting embodiments. In this example, optical transceiver 406 includes a bank of modulators (mod) 702, a multiplexer (mux) 704, a de-multiplexer (demux) 706, and a bank of photodetectors (pd) 708. Laser 402 may be configured to emit multiple wavelengths (for example in the optical C-band or O-band), each of which may be routed to a corresponding modulator 702 using appropriate optical components (not illustrated in FIG. 7). The carriers associated with these wavelengths may be modulated with data streams provided by memory controller 404. The data streams may be combined together using mux 704 and may be transmitted to the other end of optical fiber 208. While this example illustrates a single optical fiber for the transmission and reception of data, separate optical fibers may be used in other embodiments. Data streams at different wavelength may be received through optical fiber 208 and may be spatially separated using demux 706. The carrier of each corresponding wavelength may be converted to the electrical domain using photodetectors 708. Direct and/or coherent detection schemes may be used. The data extracted from the carriers in this way may be provided to memory controller 404, which may for example execute write operations in the DRAM layers 1, 2 . . . N.

In other embodiments not illustrated herein, discrete external WDM components (e.g., multiplexers and de-multiplexers) may be used to combine data streams from different OISMs into common optical fibers. For example, each OISM may be uniquely assigned to a specific wavelength.

Figure 8:
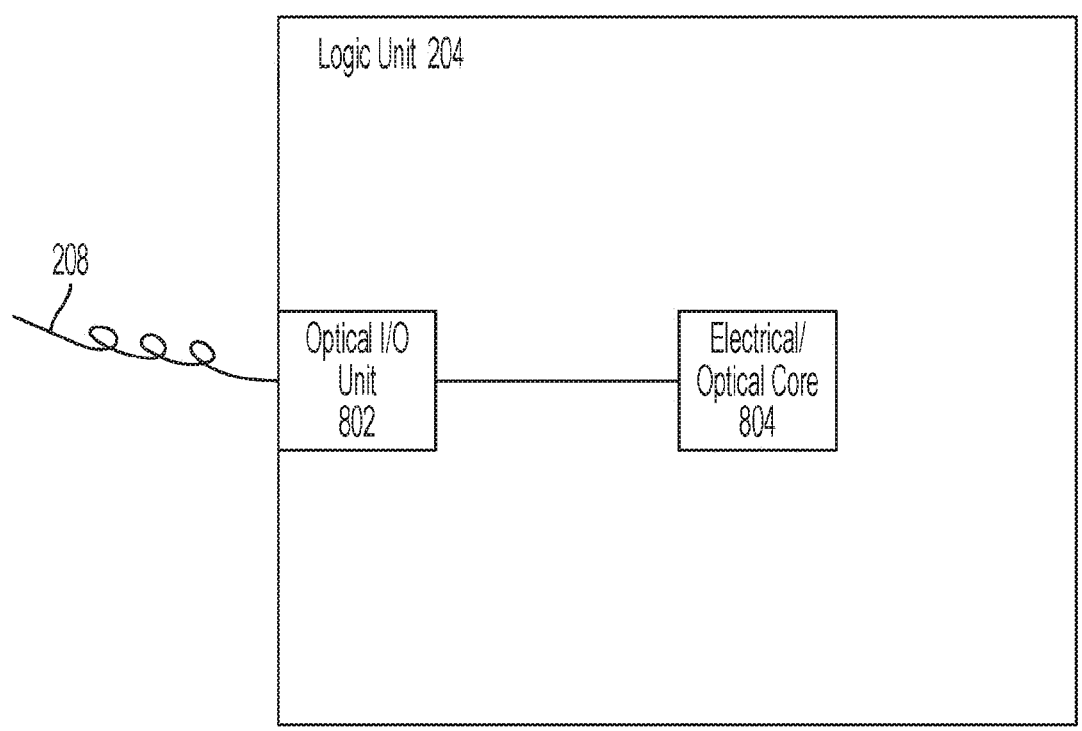
FIG. 8 is a schematic diagram of a representative logic unit that may be used with the system of FIG. 2, in accordance with some non-limiting embodiments.

Similarly, logic unit 204 may include optical circuits for transmitting and receiving data through optical carriers. An example of such a logic unit is illustrated in FIG. 8, according to some non-limiting embodiments. In this case, logic unit 204 includes an optical input-output (I/O) unit 802 coupled to an optical fiber 208 (only one optical fiber is illustrated in this example though multiple optical fibers may be interfaced through optical I/O unit 802). Optical I/O unit 802 may include optical devices similar to those of optical transceiver 406, including for example lasers, modulators, photodetectors, multiplexers and de-multiplexers. Optical I/O unit 802 may be coupled to the core of logic unit 204—electrical/optical core 804. Core 804 may include circuitry for processing data in the electrical domain and/or circuitry for processing data in the optical domain. Core 804 may be programmed with instructions that, when executed, may run different operations including for example deep learning algorithms.

Figure 9:
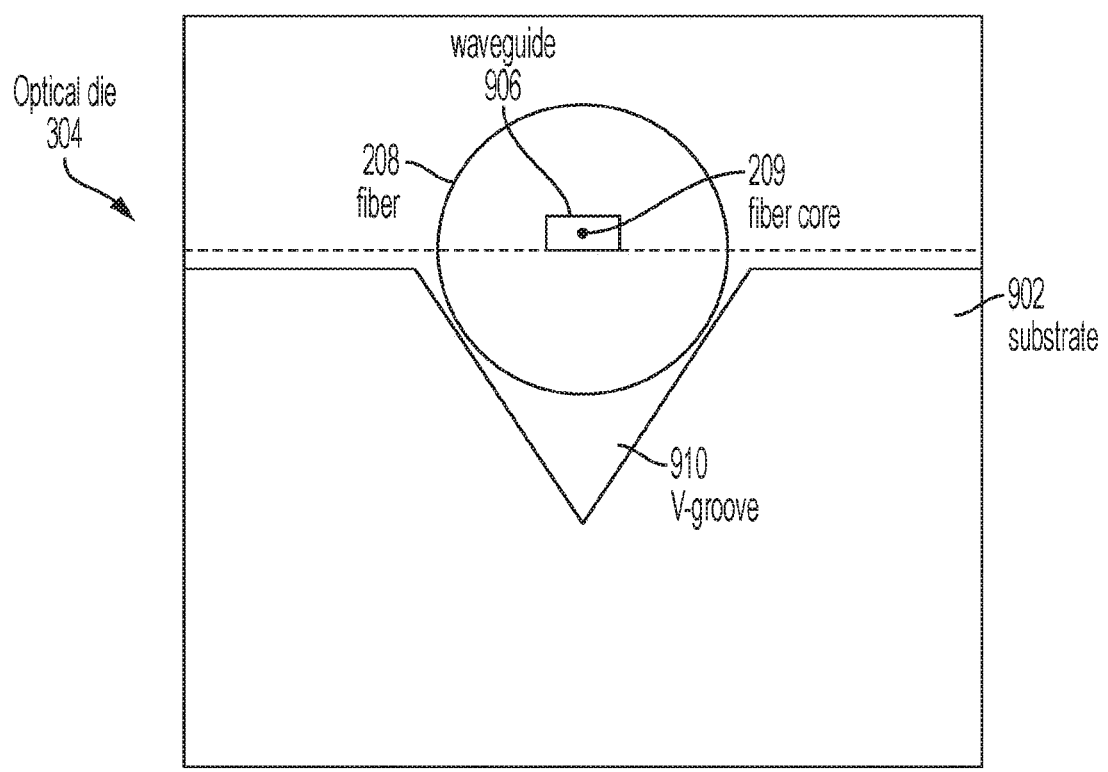
FIG. 9 is a side view of an optical die that includes a v-groove, in accordance with some non-limiting embodiments.

Optical fiber 208 may be coupled to a chip (e.g., OISM 206 or logic unit 204) in any suitable manner including for example via edge-coupling through a side edge of the chip, or alternatively, via surface-coupling through a top or bottom surface of the chip. In some of the embodiments in which edge-coupling is used, v-grooves may be employed for physically coupling the optical fiber to the chip. An example of a v-groove that may be used in connection with optical die 304 is illustrated in FIG. 9, according to some non-limiting embodiments. In the example of FIG. 9, which illustrates a side edge of optical die 304, a v-groove is formed on the substrate 902. The v-groove may be obtained for example by etching the substrate along its crystallographic directions. The v-groove may be sized such that, when an optical fiber (e.g., an SMF-28) is positioned therein, the core 209 of the optical fiber is aligned to a corresponding waveguide 906 formed in the optical die. In this way, the waveguide 906 and the core 209 may be optically couple to each other with low insertion losses.

In other embodiments, optical grating couplers may be used to enable surface-coupling between waveguides and optical fibers. The optical grating couplers may be arranged to couple out-of-plane modes to the modes of the waveguides. In these embodiments, optical fibers may be attached to the top (or bottom) surface of the optical die such that the end of the optical fiber is substantially perpendicular to the die's surface.

Figure 10B:
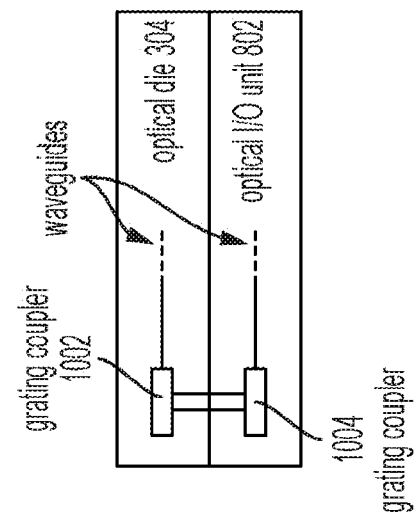
FIG. 10B illustrates a portion of the system of FIG. 10A in additional detail, in accordance with some non-limiting embodiments.
Figure 10A:
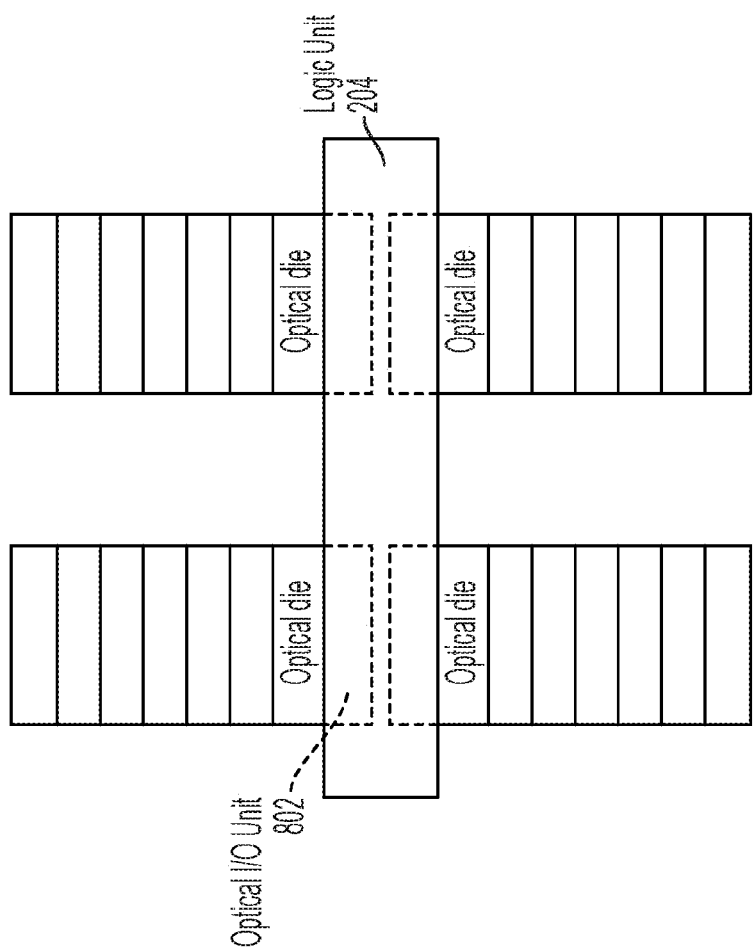
FIG. 10A is a side view of a system in which OISMs are bonded directly to a logic unit, in accordance with some non-limiting embodiments.

In yet other embodiments, different dies may be optically coupled to each other without having to use optical fibers. One such example is illustrated in FIG. 10A, in accordance with some non-limiting embodiments. As shown, one or more OISMs may be attached directly to a logic unit 204. In this example, a pair of OISMs is attached to the top surface of logic unit 204 and a pair of OISMs is attached to the bottom surface of logic unit 204. The structure of FIG. 10A may be disposed on a PCB (not illustrated in FIG. 10A). In other embodiments, OISMs may be coupled to only one surface of logic unit 204. Any suitable number of OISMs may be attached to a logic unit 204 as shown in FIG. 10A, such as more than 5, more than 10, more than 20, more than 30, more than 50 or more than 100.

The OISMs may communicate with the logic unit via free space optics. That is, optical modes propagate between an OISM and a logic unit as free space optical beams. In one example, optical grating couplers are used to couple optical modes outside the plane of the chip. One grating coupler may be disposed in an optical die 304 and another grating coupler may be disposed in an optical I/O unit 802. In this case, logic unit 204 incudes at least one optical I/O unit 802 for each optical die to which it is coupled. A representative optical die/optical I/O unit pair is illustrated in FIG. 10B. In this example, optical die 304 includes grating coupler 1002, and optical I/O unit 802 includes grating coupler 1004. The grating couplers may be optically coupled to respective waveguides for routing optical signals within the chip. The grating couplers may be optically coupled to one another outside the respective planes in which they are formed. In this circumstance, an optical signal is provided to grating coupler 1002 via the respective waveguide. In response, grating coupler 1002 emits an optical beam outside the plane of the optical die 304 and towards grating coupler 1004. Grating coupler 1004 may receive the optical signal by collecting at least a portion of the beam. The signal may be then provided to the respective waveguide. Other means in addition or in alternative to grating couplers may be used, including vertical-cavity surface emitting lasers (VCSEL). The light emitted by a VCSEL may be collected using another out-of-plane coupler, or directly using a photodetector.

Figure 11B:
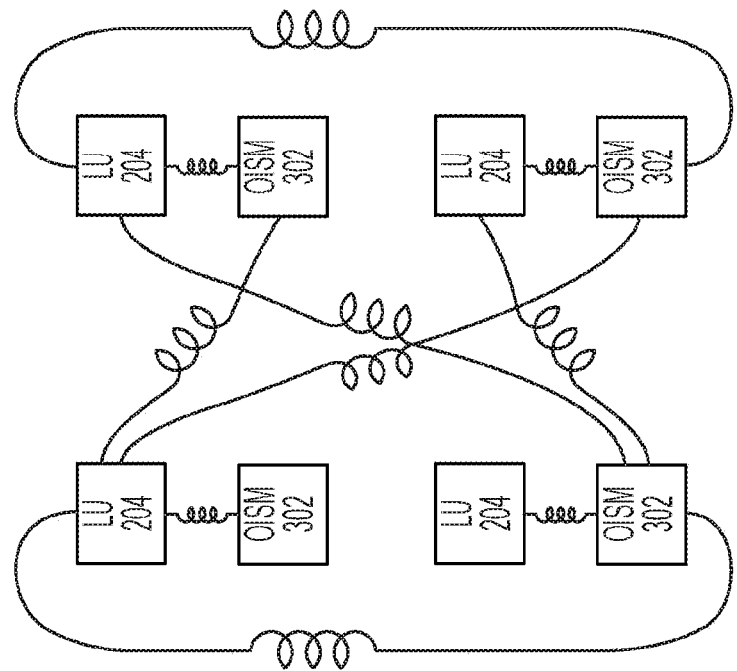
FIG. 11B is a schematic diagram of a system architecture in which multiple logic units and multiple OISMs are connected to one another, in accordance with some non-limiting embodiments.
Figure 11A:
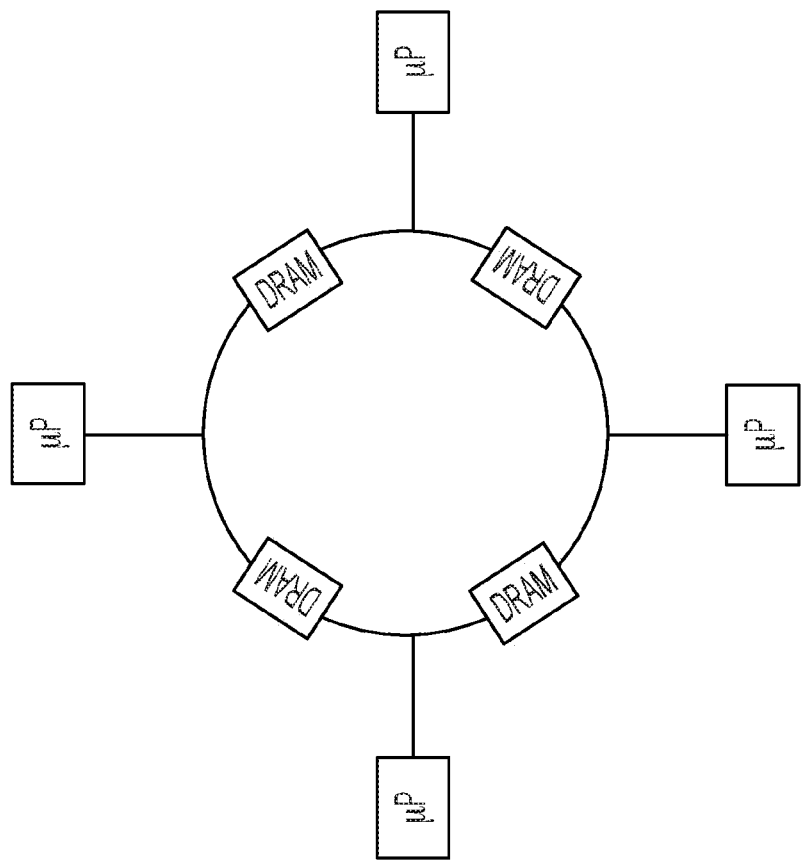
FIG. 11A is a schematic diagram of a conventional system architecture including multiple microprocessor connected to one another through a ring bus.

IV. Examples of Computer Architectures Including Optically Interfaced Stacked Memories Some conventional computer architectures are arranged such that a common bus enables communication among different points of the network. For example, ring buses are often used in computer systems to enable multiple processors to communicate with each other. An example of a conventional ring-based architecture is shown in FIG. 11A, in which a ring places multiple microprocessors in communication with each other. Multiple DRAMs may be used along the ring path to enable data buffering.

Ring architectures have traditionally been used because they can be implemented with relatively short interconnects. As shown in FIG. 11A, each DRAM is only connected to the DRAM that is adjacent to it. Therefore, this architecture can be implemented by physically positioning the DRAMs very close to one another, thus avoiding the drawbacks arising when long conductive traces are used. The limit of this architecture is that it is not scalable. The fact that the DRAMs must be positioned close to each other poses a limit to the addition of other DRAMS, because eventually, there will be no more space on the interposer hosting the DRAMs.

By increasing the distance at which DRAMs can be placed relative to one another while still providing high data rates and lower power consumption, optically interfaced stacked memories of the types described herein enable arbitrary network topologies. The use of optical channels eliminates the interconnection bottleneck and opens up the opportunity to design computer systems with virtually limitless access to memory. An example of an arbitrary computing system utilizing optically interfaced stacked memories is illustrated in FIG. 11B, in accordance with some non-limiting embodiments. As shown, the system includes multiple OISMs and multiple logic units of the types described herein. Each OISM may be optically coupled (via optical fibers or free space optics) to any of the other OISMs and/or any of the logic units. The separation between mutually optically coupled OISMs may be as large or as small as desired. Each logic unit/OIMS pair is referred to herein as a "computing node". For example, two mutually optically coupled OISMs may be separated by 1 cm or more, 10 cm or more, 50 cm or more, 1 m or more, 2 m or more, 5 m or more, 10 m or more, 50 m or more, or 100 m or more. The OISMs need not be positioned on a common PCB, although they may in some embodiments.

The topology of the network may be configured dynamically based on the needs of the application running on the network. If needed, for example, all-to-all, point-to-multipoint, or even ring architectures, may be implemented. In some embodiments, WDM techniques may be used to reduce the number of optical fibers in the system.

V. Fabrication of Optically Interfaced Stacked Memories

Figure 12:
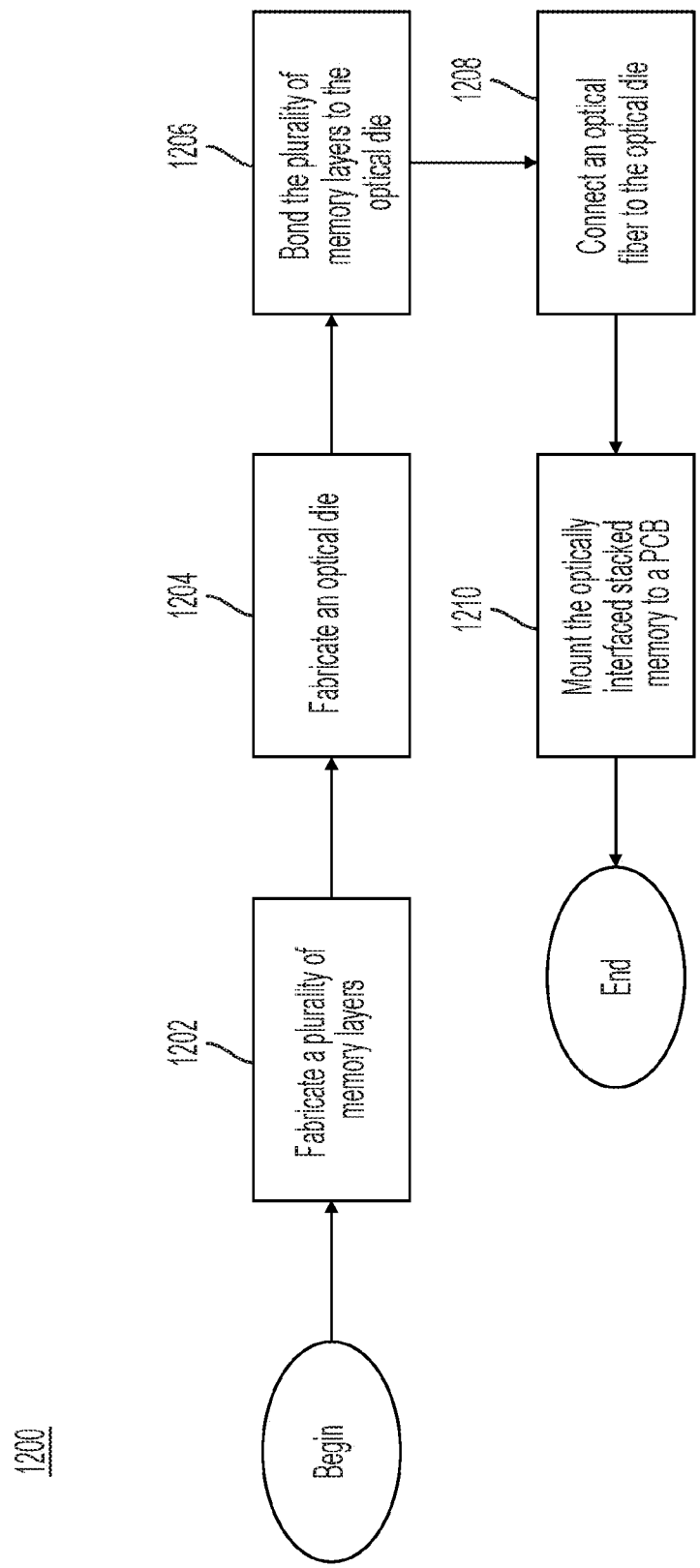
FIG. 12 is a flowchart illustrating an example of a method for fabricating optically interfaced stacked memories, in accordance with some non-limiting embodiments.

Some embodiments relate to methods for fabricating optically interfaced stacked memories of the types described herein. FIG. 12 shows an example of such a method, according to some non-limiting embodiments. Method 1200 begins at act 1202, in which a plurality of memory layers are fabricated. Each layer may be formed on a separate silicon die. Types of memory layers that can be fabricated at act 1202 include DRAMs, SRAMS, NANDs, Flash memories, etc, one example being described in connection with FIG. 3. The memory layers may be fabricated using any suitable fabrication nodes, such as less than or equal to 45 nm, less than or equal to 32 nm, or less than or equal to 22 nm, less than or equal to 14 nm, less than or equal to 10 nm, less than or equal to 7 nm or less than or equal to 5 nm. The memory layers may be stacked together using any suitable technique, including for example 3D stacking techniques and flip-chip bonding. Once stacked, the memory layers may be placed in mutual communication using interconnects such as through silicon vias and/or through oxide vias.

At act 1204, an optical die may be fabricated to include an optical transceiver and a memory controller. An example of an optical die that may be fabricated at act 1204 is described in connection with FIG. 4. The optical die may be fabricated in the same foundry as the memory layers of act 1202, or in a separate foundry. In some embodiments, the optical die is fabricated using a fabrication node smaller than the fabrication node used for the memory layers (though the same fabrication node may be used in other embodiments). For example, a 45 nm-fabrication node may be used in some embodiments. In some embodiments, the optical die may be fabricated to include a structure for enabling optical alignment of optical fibers, including for example v-grooves of the types described in connection with FIG. 9.

At act 1206, the memory layers of act 1202 may be bonded to the optical die of act 1204. In some embodiments, the optical die is bonded to the memory layers in the same production facility in which the memory layers are bonded to each other. In other embodiments, these steps occur in different production facilities. Any of numerous bonding techniques may be used including flip-chip bonding or other three-dimensional (3D) integration techniques. Through silicon vias, through oxide vias or other types of interconnects may enable communication between the memory controller and the memory layers. In some embodiments, the optically interfaced stacked memory may be packaged within a housing. The package may include cooling devices and systems such as heat spreaders, heat sinks, heat pipes, thermoelectric coolers, fans, thermoconductive materials, etc.

At act 1208, one or more optical fibers may be connected to the optical die such that the optical fibers are in optical communication with the optical transceiver. In some embodiments, the optical fiber(s) are disposed within v-grooves for improved optical alignment. At act 1210, the optically interfaced stacked memory may be mounted on a printed circuit board or other substrates.

It should be appreciated that acts 1202-1210 may be performed in any suitable order including but not limited to the order illustrated in FIG. 12

VI. Conclusion

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide optically interfaced stacked memories that, relative to conventional memory units, offer greater degrees of scalability in terms of memory bandwidth and overall memory capacity that can be used in a computer system. The optically interfaced stacked memories of the types described herein, in fact, can provide additional memory bandwidth with insignificant increases in power consumption.

As a result, the optically interfaced stacked memories described herein provide a greater flexibility in the design of a computer architecture as the memory units can be positioned as far away as one desires, even kilometers away.

Being three-dimensionally stacked, the memories of the types described herein provide a substantial increase, relative to conventional memories, in the amount of memory density per unit area.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A memory device comprising:
a plurality of stacked memory layers, each of the plurality of stacked memory layers comprising a plurality of memory cells; and
an optical die bonded to the plurality of stacked memory layers and in electrical communication with at least one of the plurality of stacked memory layers through one or more interconnects, the optical die formed on a substrate, the optical die comprising:
an optical transceiver comprising an optical waveguide integrated on the substrate; and
a memory controller configured to control read and/or write operations of the at least one of the plurality of stacked memory layers, the memory controller comprising a transistor co-integrated with the optical waveguide on the substrate.

2. The memory device of claim 1, wherein the one or more interconnects comprises one or more through silicon vias (TSV).

3. The memory device of claim 1, wherein the memory controller comprises at least one logic element.

4. The memory device of claim 1, wherein the plurality of memory cells comprises a plurality of solid state memory cells.

5. The memory device of claim 1, wherein the optical die is positioned at one end of the plurality of stacked memory layers.

6. The memory device of claim 1, wherein the optical die further comprises an optical coupler arranged for edge-coupling an optical fiber to the optical transceiver.

7. The memory device of claim 1, wherein the optical transceiver comprises at least one photodetector and at least one optical modulator.

8. The memory device of claim 1, wherein the optical die is 3D bonded to the plurality of stacked memory layers.

9. The memory device of claim 1, wherein the optical die has a surface defining a plane, and the optical die further comprises a grating coupler configured to be coupled to an out-of-plane optical mode.

10. A method for accessing a memory device comprising a plurality of stacked memory layers and an optical die, the optical die being formed on a substrate and the optical die comprising an optical transceiver and a memory controller, the method comprising:
with an optical waveguide of the optical transceiver, receiving an optical signal, wherein the optical waveguide is integrated on the substrate;
with the optical transceiver, converting the optical signal to an electrical signal; and
with the memory controller, generating, based on the electrical signal, a plurality of control signals and transmitting the plurality of control signals to the plurality of stacked memory layers, wherein the memory controller comprises a transistor co-integrated with the optical waveguide on the substrate.

11. The method of claim 10, further comprising:
with at least one of the plurality of stacked memory layers, performing at least one write and/or read operation in response to receiving the plurality of control signals.

12. The method of claim 10, further comprising:
with a logic unit optically coupled through an optical fiber to the die, transmitting the optical signal to the optical transceiver.

13. The method of claim 10, further comprising:
with the memory controller, receiving one or more bits from at least one of the plurality of stacked memory layers, and
with the optical transceiver, encoding an optical transmission signal with the one or more bits.

14. A computing system comprising:
a logic unit having an optical input/output (I/O) interface;
an optical channel optically coupled to the I/O interface of the logic unit;
a memory device comprising:
a plurality of stacked memory layers, each of the plurality of stacked memory layers comprising a plurality of memory cells; and
an optical die bonded to the plurality of stacked memory layers and in electrical communication with at least one of the plurality of stacked memory layers through one or more interconnects, the optical die formed on a substrate, the optical die comprising:
an optical transceiver comprising an optical waveguide integrated on the substrate, the optical transceiver being optically coupled to the optical channel; and
a memory controller configured to control read and/or write operations of the at least one of the plurality of stacked memory layers, wherein the memory controller comprises a transistor co-integrated with the optical waveguide on the substrate.

15. The computing system of claim 14, wherein the one or more interconnects comprises one or more through silicon vias (TSV).

16. The computing system of claim 14, wherein the optical die is 3D bonded to the plurality of stacked memory layers.

17. The computing system of claim 14, wherein the optical channel comprises an optical fiber having a first end coupled to the I/O interface and a second end coupled to the optical die.

18. The computing system of claim 14, wherein the optical channel comprises a free space optical channel.

19. The computing system of claim 18, wherein the memory device is positioned on a surface of the logic unit, the surface of the logic unit defining a plane, and wherein the memory device comprises a first out-of-plane coupler and the logic unit comprises a second out-of-plane coupler, the first out-of-plane coupler being optically coupled to the second out-of-plane coupler through the optical channel.

20. The computing system of claim 19, wherein at least one between the first and second out-of-plane couplers comprises a grating coupler.

21. The computing system of claim 14, wherein the logic unit comprises optical circuitry for processing data in the optical domain.

22. The computing system of claim 14, wherein the logic unit and the memory device are disposed on a common printed circuit board (PCB), and wherein the computing system lacks interposers between the PCB and the memory device.

23. A computing system comprising:
a plurality of computing nodes comprising at least first, second and third computing nodes, each of the plurality of computing nodes comprising:
 a logic unit; and
 a memory device optically coupled to the logic unit, wherein the memory device comprises:
  a plurality of stacked memory layers; and
  an optical die bonded to the plurality of stacked memory layers and in electrical communication with at least one of the plurality of stacked memory layers through one or more interconnects, the optical die formed on a substrate, the optical die comprising:
   an optical transceiver comprising an optical waveguide integrated on the substrate; and
   a memory controller configured to control read and/or write operations of the at least one of the plurality of stacked memory layers, wherein the memory controller comprises a transistor co-integrated with the optical waveguide on the substrate,
 wherein the first computing node is optically coupled to the second computing node and the third computing node.

24. The computing system of claim 23, wherein the logic unit of the first computing node is optically coupled to the memory device of the second computing node and the memory device of the third computing node.

25. The computing system of claim 23, wherein the plurality of computing nodes form an all-to-all architecture, a point-to-multipoint architecture or a ring architecture.

26. The computing system of claim 23, wherein the first computing node is optically coupled to the second computing node through an optical fiber that is longer than 10 cm.

27. The memory device of claim 1, wherein the optical waveguide and the transistor are formed in a common silicon layer of the substrate.

28. The computing system of claim 14, wherein the optical waveguide and the transistor are formed in a common silicon layer of the substrate.

29. The computing system of claim 23, wherein the optical waveguide and the transistor are formed in a common silicon layer of the substrate.

* * * * *